United States Patent
Choi et al.

(10) Patent No.: US 9,730,319 B2
(45) Date of Patent: Aug. 8, 2017

(54) PRINTED CIRCUIT BOARD

(71) Applicant: LG INNOTEK CO., LTD., Seoul (KR)

(72) Inventors: Man Hue Choi, Seoul (KR); Min Jae Kim, Seoul (KR); Se Woong Na, Seoul (KR); Hyun Gyu Park, Seoul (KR); In Hee Cho, Seoul (KR); Seung Kwon Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/568,544

(22) Filed: Dec. 12, 2014

(65) Prior Publication Data
US 2015/0173180 A1    Jun. 18, 2015

(30) Foreign Application Priority Data
Dec. 12, 2013  (KR) ..................... 10-2013-0154863

(51) Int. Cl.
*H05K 1/02* (2006.01)
*H05K 1/18* (2006.01)
*H05K 3/28* (2006.01)
*G02F 1/1335* (2006.01)

(52) U.S. Cl.
CPC .......... *H05K 1/0281* (2013.01); *H05K 1/181* (2013.01); *G02F 1/133615* (2013.01); *G02F 2001/133612* (2013.01); *H05K 1/0278* (2013.01); *H05K 1/189* (2013.01); *H05K 3/28* (2013.01); *H05K 2201/046* (2013.01); *H05K 2201/10106* (2013.01)

(58) Field of Classification Search
CPC ....... H05K 1/0281; H05K 2201/10106; H05K 3/28; H05K 1/189; H05K 1/14; H05K 1/141; H05K 1/16; H05K 1/18; H05K 1/181; H05K 2201/10492; H05K 3/36; H05K 3/341; H05K 1/0278; H05K 1/028; H05K 1/118; H05K 1/148; H05K 2201/046; G02F 1/1336
USPC ......... 174/250–268; 361/749, 752, 760, 236, 361/543, 544, 249.01, 249.02, 249.06, 361/249.11, 249.14; 40/552
See application file for complete search history.

(56) References Cited

U.S. PATENT DOCUMENTS

| | | | | |
|---|---|---|---|---|
| 5,161,009 A | * | 11/1992 | Tanoi | H01L 23/4985 257/668 |
| 7,250,575 B2 | * | 7/2007 | Nagao | H05K 1/028 174/250 |
| 8,071,882 B2 | * | 12/2011 | Okajima | H05K 1/0203 174/250 |
| 8,657,468 B2 | * | 2/2014 | Im | F21S 48/1109 174/254 |
| 2002/0008463 A1 | * | 1/2002 | Roach | G09F 9/305 313/492 |

\* cited by examiner

*Primary Examiner* — Ishwarbhai B Patel
(74) *Attorney, Agent, or Firm* — KED & Associates, LLP

(57) ABSTRACT

Provided is a printed circuit board, including: a support substrate including a first region in which light emitting elements are mount, a second region extending from the first region, and a bending portion between the first region and the second region, an insulating substrate on the support substrate, wiring portions on the insulating substrate, and a protective layer on the wiring portions.

15 Claims, 8 Drawing Sheets

PRINTED CIRCUIT BOARD

CROSS-REFERENCE TO RELATED PATENT APPLICATIONS

This application claims priority under 35 U.S.C. §119 to Korean Application No. 10-2013-0154863, filed on Dec. 12, 2013, whose entire disclosure is incorporated herein by reference.

BACKGROUND

1. Field

Embodiments of the present application relate to a printed circuit board.

2. Background

Since a liquid crystal display (LCD) has no self-luminous which can make its own light, a separate lighting device is needed for all the liquid crystal display devices. Such a lighting device serves as a light source of the liquid crystal display, and a backlight unit (BLU) refers to a complex composed of a light source for irradiating light to a rear surface of a liquid module, a power circuit for driving the light source, and all components for enabling the formation of uniform flat light.

The liquid crystal display becomes gradually thinner, and accordingly, a reduction in a bezel width of the liquid crystal display has been needed. As one example, in order to reduce a bezel width, the structure of a printed circuit board to which light emitting elements are mounted, or the structure of a lighting device including a light guide plate for guiding light of the light emitting devices has been changed.

However, as the structure of the printed circuit board becomes thinner, it is problematic in that wirings connected to the lighting emitting elements are damaged. Accordingly, ways to change the structure of the printed circuit board to a slim structure without damage to the wirings of the printed circuit board have been needed.

BRIEF DESCRIPTION OF THE DRAWINGS

The embodiments will be described in detail with reference to the following drawings in which like reference numerals refer to like elements wherein.

DETAILED DESCRIPTION

Figure 1:
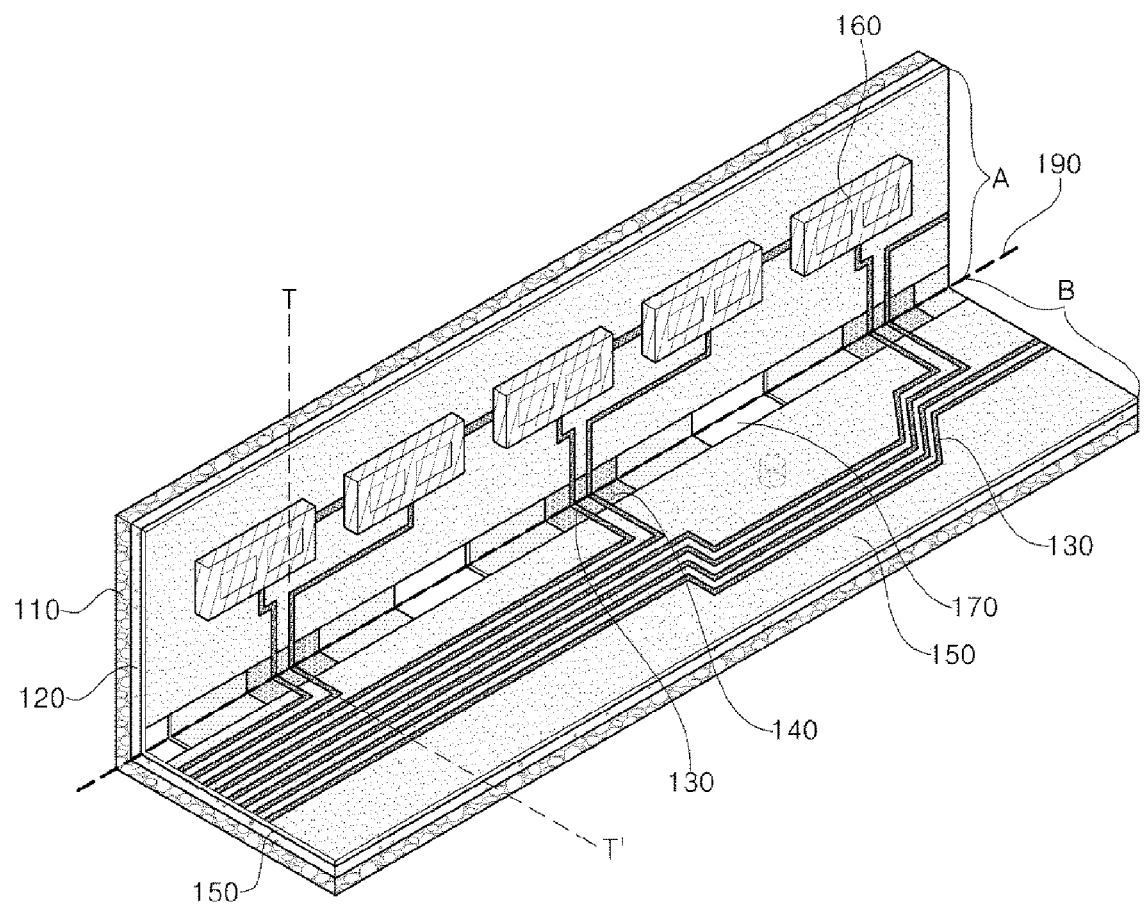
FIGS. 1 to 3 are views illustrating a printed circuit board according to one embodiment of the present application.

The present application will now be described more fully hereinafter with reference to the accompanying drawings, in which exemplary embodiments of the invention are shown. The invention may, however, be embodied in different forms and should not be construed as limited to the embodiments set forth herein. In the following description, it is to be noted that, when the functions of conventional elements and the detailed description of elements related with the present application may make the gist of the present application unclear, a detailed description of those elements will be omitted. Also, it should be understood that the shape and size of the elements shown in the drawings may be exaggeratedly drawn to provide an easily understood description of the structure of the present application.

Figure 2:
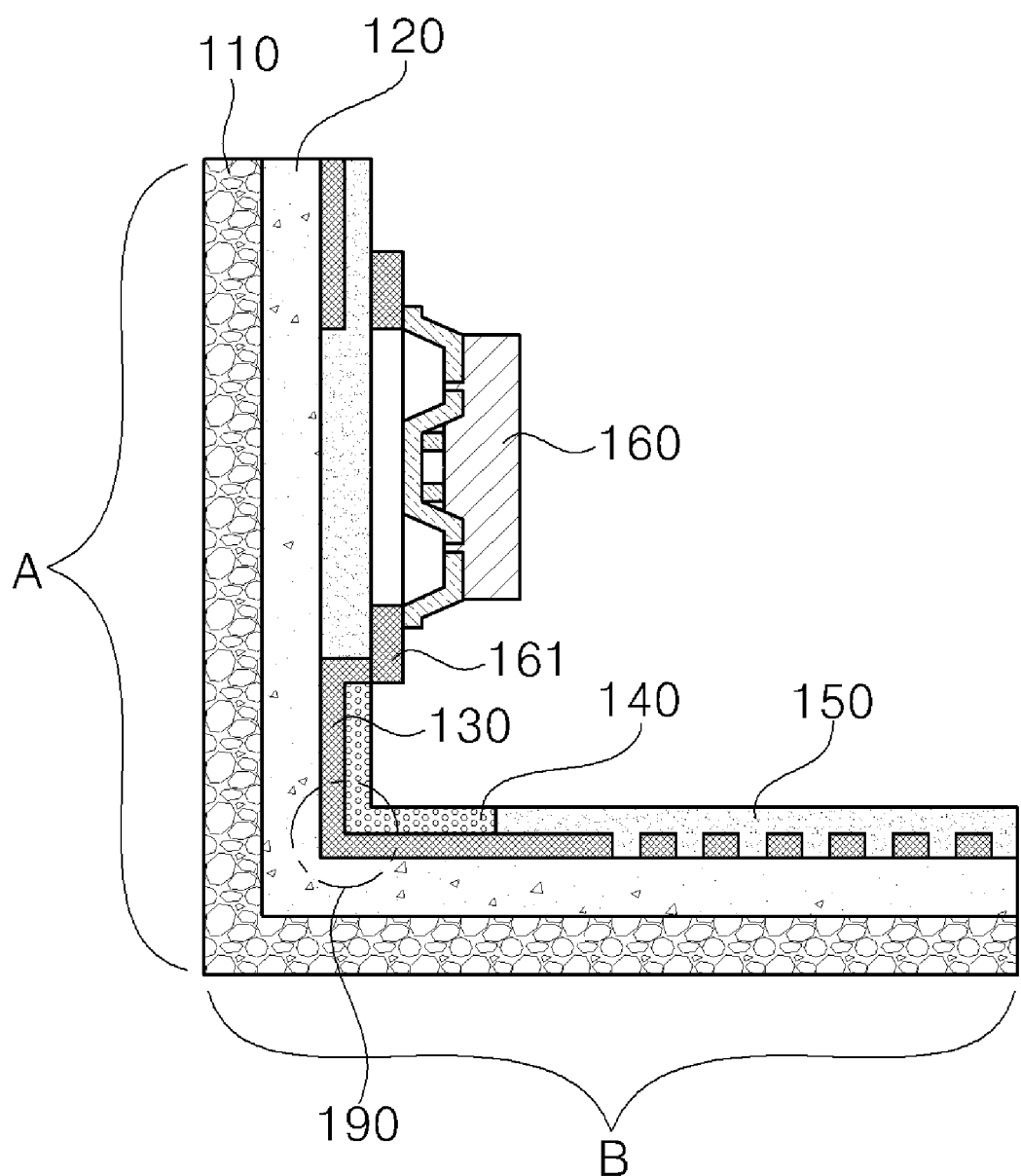
Figure 3:
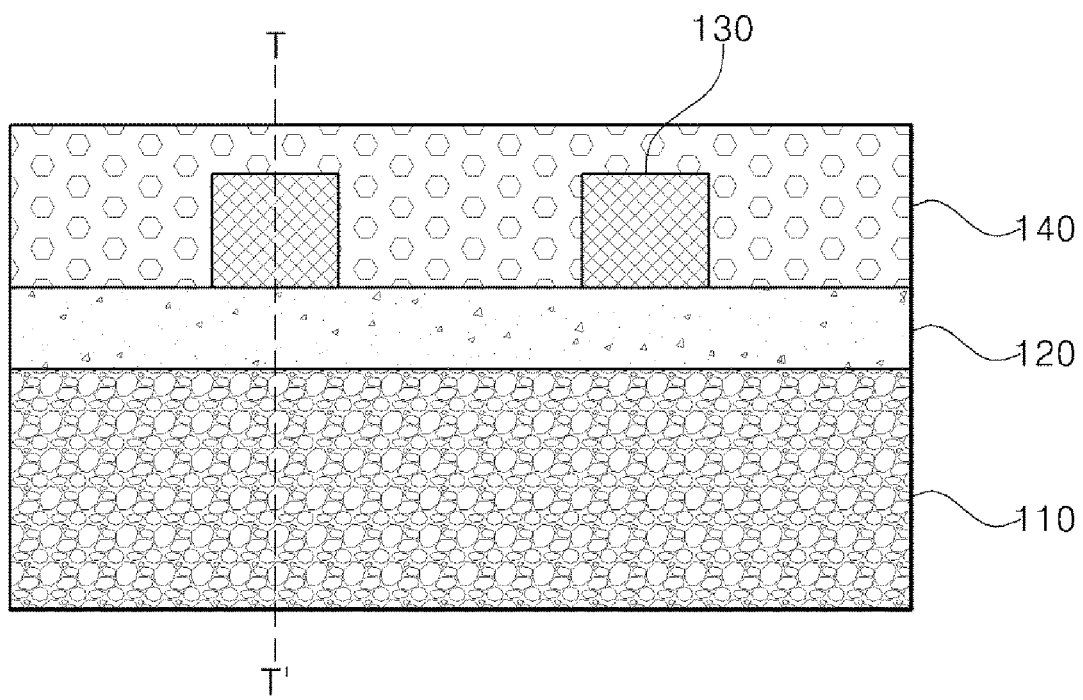

FIGS. 1 to 3 are views illustrating a printed circuit board according to one embodiment of the present application. More specifically, FIG. 2 is a view illustrating a cross section taken along lines T-T' and FIG. 3 is a view illustrating a cross section of a bending portion of the printed circuit board.

The printed circuit board according to one embodiment of the present application will be hereinafter described with reference to FIGS. 1 to 3.

FIG. 1 shows one example of the present application in which protective layer 140 is disposed within a predetermined range from wiring portions 130 of a bending portion 190, more specifically, an example in which the protective layer 140 is only disposed around the wiring portions 130.

As illustrated in FIG. 1, the printed circuit board according to the present embodiment of the invention includes: a support substrate 110; an insulating substrate 120; wiring portions 130; and protective layer 140.

The support substrate 110 of the printed circuit board is divided into a first region A and a second region B by the bending portion 190.

The first region A of the printed circuit board is a region to which light emitting elements 160 are mounted, and the second region B is a region extending from the first region A. The plurality of wirings 130 is formed in the second region B.

At this time, the support substrate 110 may contain at least one of Al, Au, Ag, Cr, an organic compound, an inorganic compound, a magnetic material and a conductive material.

The insulating substrate 120 may be formed on the support substrate 110.

At this time, the insulating substrate 120 may be made of at least one of PET (Polyethylene Terephthalate), PC (Polycarbonate), PES (polyether sulfone), PI (Polyimide) and PMMA (PolyMethly MethaAcrylate).

The wiring portions 130 are formed on the insulating substrate 120 configured as described above, and the protective layer 140 is formed on the wiring portions 130.

In the embodiment of FIGS. 1 to 3, the protective layer 140 is only formed around the wiring portions 130.

More specifically, as illustrate in FIG. 2, the insulating substrate 120 is formed on the support substrate 110, and the wiring portion 130 is formed on the insulating substrate 120, wherein the protective layer 140 is formed on the wiring portion 130 of the bending portion 190, and a protective laminated layer portion 150 is formed on the wiring portion 130 in the remaining area except for the bending portion so that the protective layer 140 can be formed on the same plane as that of the protective laminated layer portion 150 in the remaining area except for the bending portion 190.

To form such a configuration, a groove is formed in the protective laminated layer portion 150 of an upper part of the wiring portion 130 so that the wiring portion 130 is exposed, and the protective layer 140 may be formed to cover the wiring portion 130.

As illustrated in FIG. 1, bending holes 170 are formed in the bending portion 190, and the bending holes 170 function to prevent the printed circuit board from being damaged upon forming of the bending portion 190 of the printed circuit board. In the embodiment of FIGS. 1 to 3, the protective layer 140 is configured not to be formed in the bending holes 170.

Meanwhile, the protective layer 140 may be made of a solder resist, and more specifically, the protective layer 140 may be made of at least one of polyimide, polyester, epoxy resin, phenolic resin, silicon, polypropylene and teflon.

As illustrated in FIG. 2, a pad wiring 161 of the light emitting element 160 is connected to the wiring portion 130 formed as described above.

At this time, the wiring portion 130 may contain Cu. More specifically, the wiring portion may be formed by laminating Cu, or at least one of Cu, Ni, Au, Al and Ag, or may be made of an alloy thereof.

FIG. 3 illustrates a cross section of on the bending portion 190 of the printed circuit board according to one embodiment of the present application.

As illustrated in FIG. 3, the insulating substrate 120 is formed on the support substrate 110, and the wiring portions 130 are formed on the insulating substrate 120.

The protective layer 140 is formed on the wiring portions 130, and at this time, the wiring portions 130 may be formed lower than an upper surface of the protective layer 140.

As shown in the embodiment of FIGS. 1 to 3, when the protective layer is formed in the bending portion of the printed circuit board, the bending portion can be prevented from being damaged upon bending of the printed circuit board, thereby making the production of the printed circuit board easier.

Figure 4:
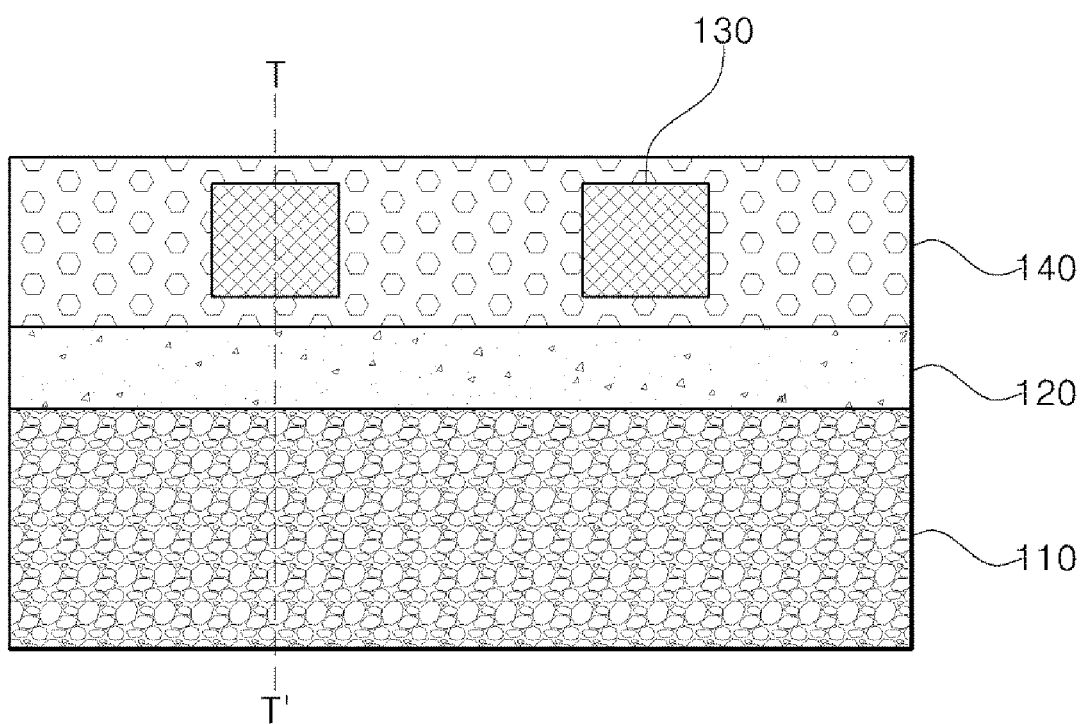
FIG. 4 is a view illustrating a cross section of a printed circuit board according to another embodiment of the present application.

FIG. 4 is a view illustrating a cross section of a printed circuit board according to another embodiment of the present application.

As illustrated in FIG. 4, a printed circuit board according to another embodiment of the present application is configured such that the insulating substrate 120 is formed on a support substrate 110, and the wiring portions 130 are formed on the insulating substrate 120.

At this time, in the embodiment of FIG. 4, the wiring portions 130 may be formed in the protective layer 140 not to come into direct contact with the insulating substrate 120.

To do so, the protective layer 140 may be configured in such a manner that the protective layer in a thin film form is formed on the insulating substrate 120, and thereafter, the wiring portions 130 are formed, and the upper protective layer is again formed thereon.

At this time, an upper surface of the wiring portions 130 may be formed lower than a surface to which the protective layer 140 is exposed so that the wiring portions 130 are not exposed.

Figure 5:
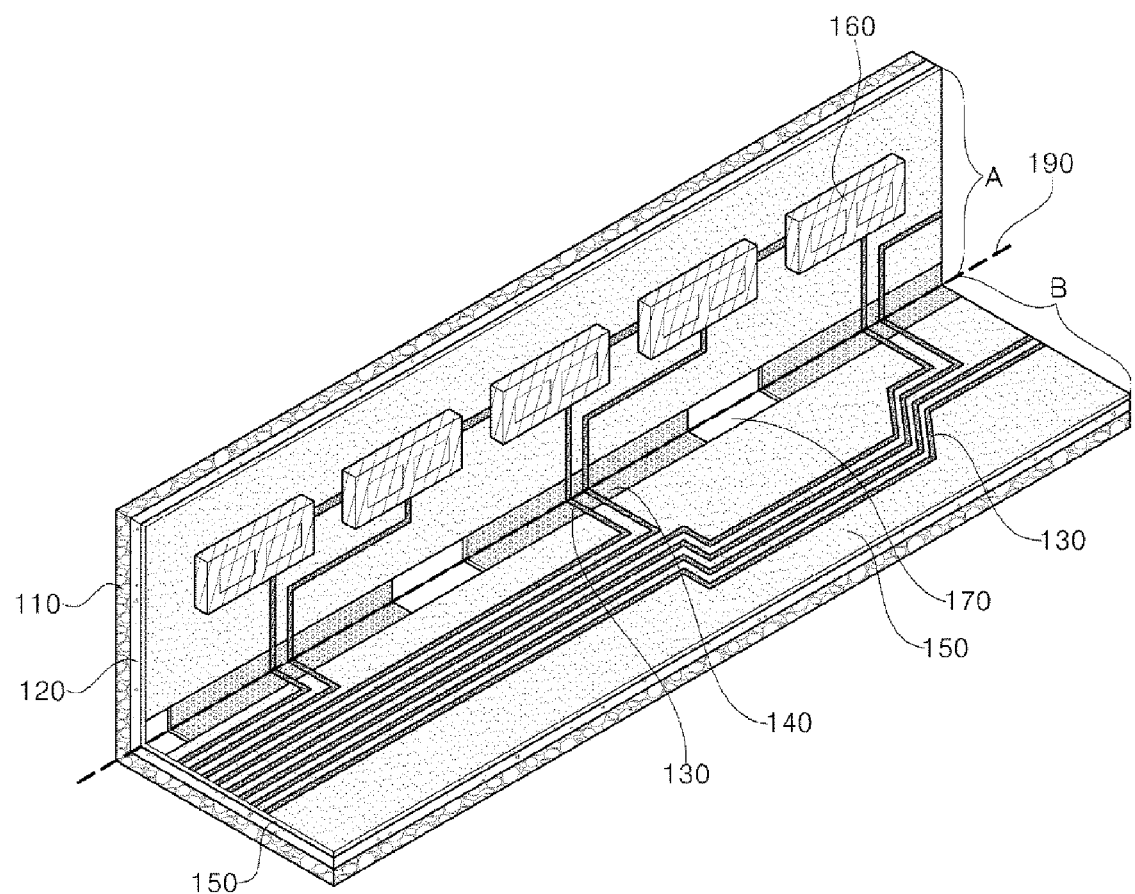
FIGS. 5 to 8 are views illustrating a printed circuit board according to still another embodiments of the present application.
Figure 8:
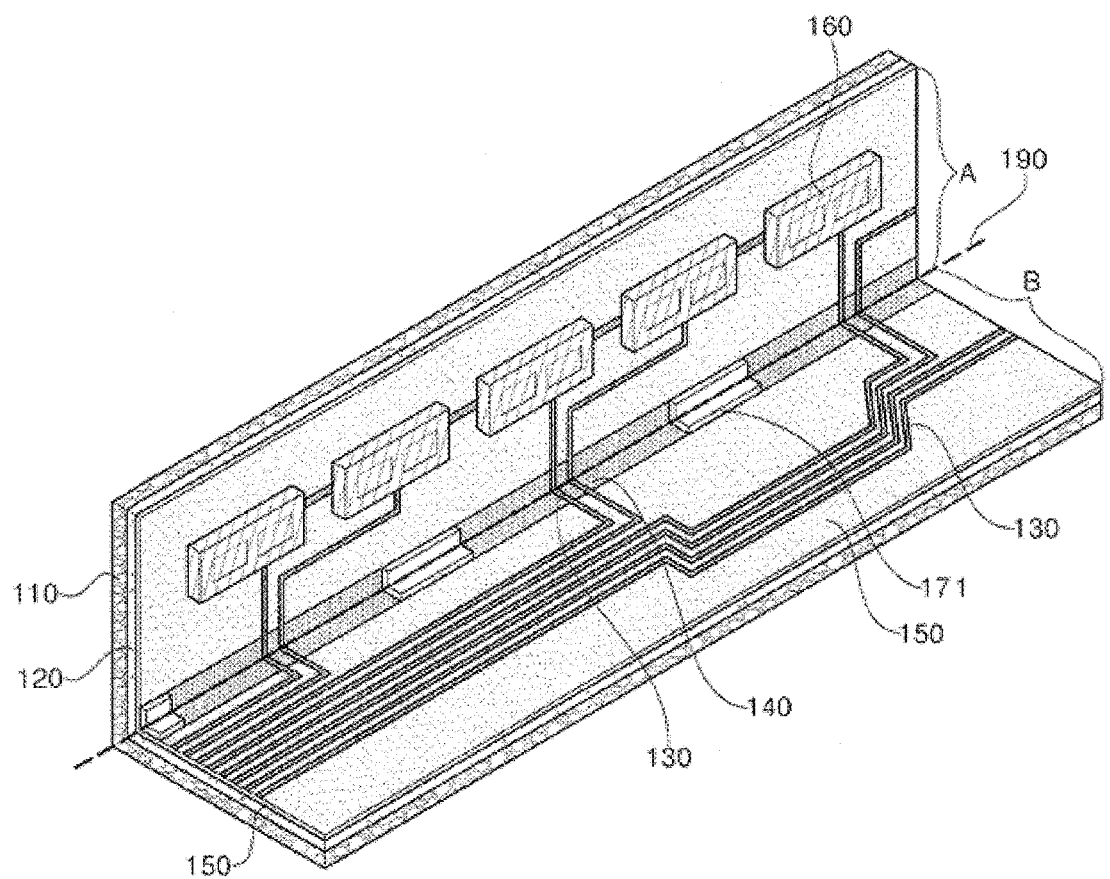

FIGS. 5 and 8 are views illustrating a printed circuit board according to still another embodiments of the present application.

More specifically, the embodiments of FIGS. 5 to 8 show that the protective layer 140 is disposed over the entire remaining area of the bending portion except for the bending holes 170 from the bending portion 190.

Like the embodiment of FIGS. 1 to 3, the printed circuit board according to the embodiment of FIG. 5 includes: the support substrate 110; the insulating substrate 120; the wiring portions 130; and the protective layer 140.

The support substrate 110 of the printed circuit board is divided into a first region A and a second region B by the bending portion 190. The first region A of the printed circuit board refers to a region to which the light emitting elements 160 are mounted, and the second region B refers to a region extending from the first region A. The plurality of wirings 130 is formed in the second region B.

The support substrate 110 may contain at least one of Al, Au, Ag, Cr, an organic compound, an inorganic compound, a magnetic material and a conductive material, and the insulating substrate 120 may formed on the support substrate 110.

At this time, the insulating substrate 120 may be made of at least one of PET (polyethylene terephthalate), PC (polycarbonate), PES (polyether sulfone), PI (polyimide) and PMMA (PolyMethly MethaAcrylate).

The wiring portions 130 are formed on the insulating substrate 120 configured as shown above, and the protective layer 140 is formed on the wiring portions 130.

In the embodiment of FIG. 5, the insulating substrate is also formed on the support substrate; the wiring portions 130 are formed on the insulating substrate 120; the protective layer 140 is formed on the wiring portions of the bending portion; and the protective laminated layer portion 150 is formed on the wiring portions in the remaining area except for the bending portion.

At this time, the protective layer 140 may be made of a solder resist, and more specifically, the protective layer may be made of at least one of polyimide, polyester, epoxy resin, phenolic resin, silicon, polypropylene and teflon.

The protective laminated layer portion 150 may be made of a different material from that of the protective layer 140, and an example of the material of the protective laminated layer portion 150 may include general thermosetting plastics.

That is, according to one embodiment of the present application, the protective layer 140 on the bending portion 190 may be made of a more flexible material so that the bending portion 190 can be prevented from being damaged upon bending the printed circuit board, thereby facilitating the production of the printed circuit board and a lighting unit.

The bending holes are formed in the bending portion 190. The bending holes function to prevent the printed circuit board from being damaged upon forming the bending portion 190 by bending of the printed circuit board. At this time, in the embodiment of FIG. 5, the protective layer 140 is formed over the entire remaining area of the bending portion except for the bending holes 170.

That is, as illustrated in FIG. 5, the protective layer 140 may be formed on the bending portion 190 so as to have a predetermined width.

As such, when the protective layer 140 is formed over the entire remaining area of the bending portion 190 except for the bending holes 170, damage to the bending portion 190 of the printed circuit board can be reduced by protecting the insulating substrate 120 of the printed circuit board.

Meanwhile, like the embodiment of FIGS. 1 to 3, in the embodiment of FIG. 5, the protective layer 140 may be made of a solder resist, and more specifically, the protective layer may contain at least one of polyimide, polyester, epoxy resin, phenolic resin, silicon, polypropylene and teflon.

Figure 6:
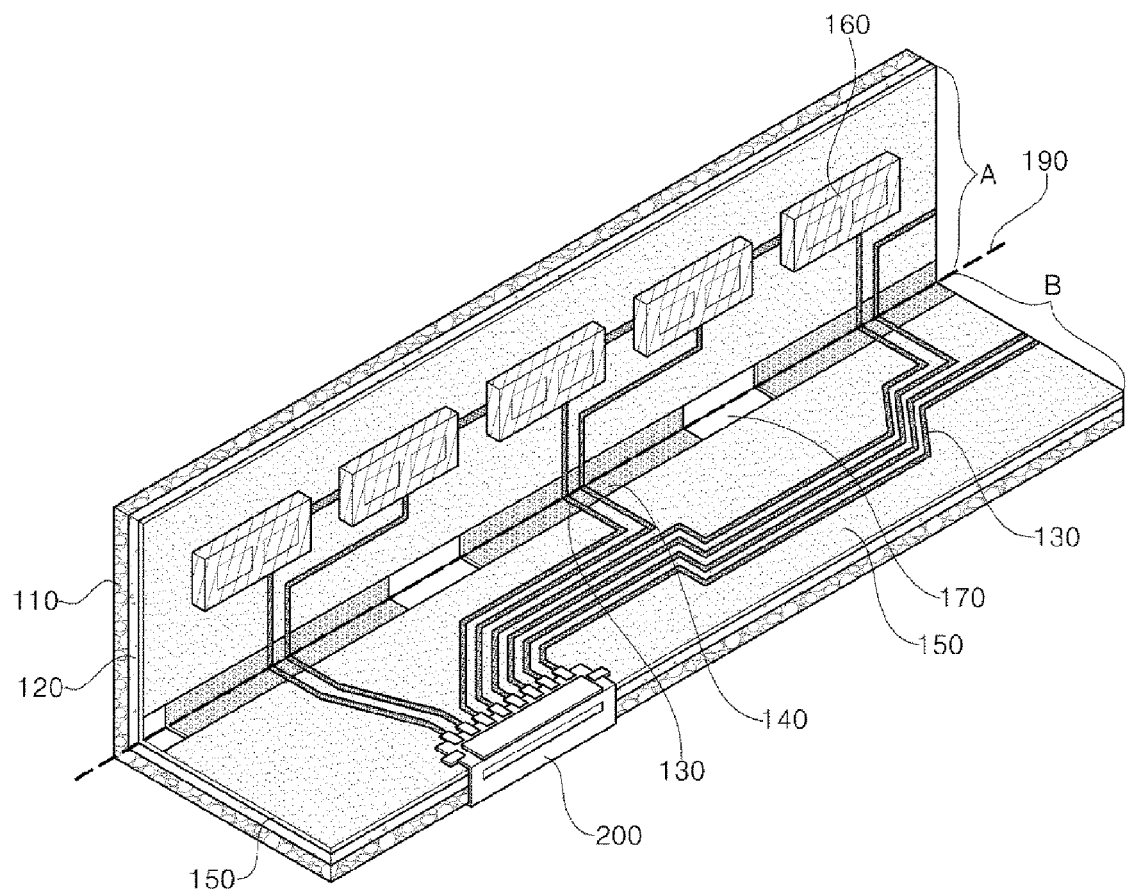
Figure 7:
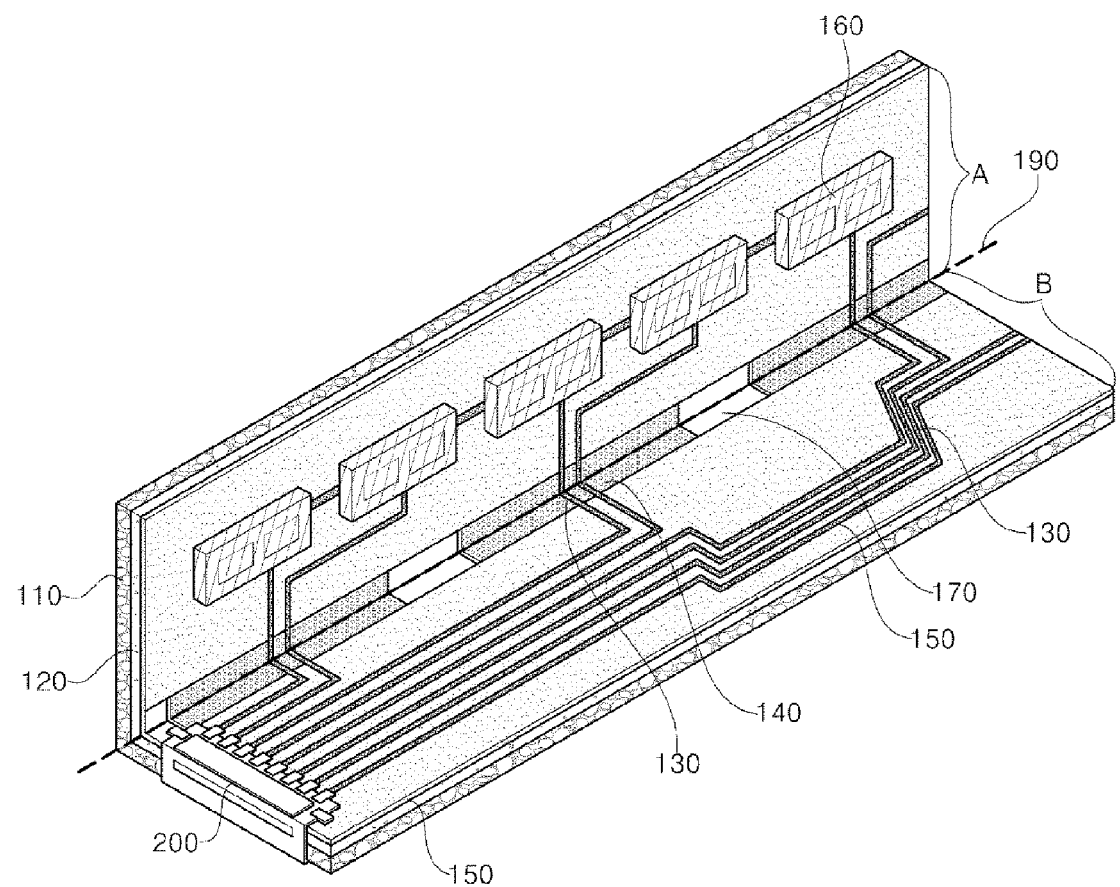

Also, as illustrated in FIGS. 6 and 7, a connector 200 connected to the wiring portions 130 may be included at one end of the printed circuit board.

More specifically, in the first region A and the second region divided by the bending portion 190, the connector 200 may be formed at one end of the second region in which the multiple wirings 130 are formed.

At this time, that is, as illustrated in FIG. 6, the connector 200 may be disposed at a side end which is parallel to an arrangement direction of the bending portion 190 on the printed circuit board, and as illustrated in FIG. 7, the connector 200 may be disposed at a side end in a different direction from the arrangement direction of the bending portion 190 on the printed circuit board.

That is, as illustrated in FIG. 6, the connector 200 may be disposed at one end of the second region B to be parallel to the arrangement direction of the bending portion 190. Unlike this, as illustrated in FIG. 7, the connector 200 may be disposed in a different direction from the arrangement direction of the bending portion 190 in the second region B.

As such, when the connector 200 is disposed at one end of the second region A of the printed circuit board, the first region A in which the light emitting elements 160 are mounted may be slimmer. Thus, a bezel of a backlight unit to which the printed circuit board is applied may be slimmer in size.

According to still another embodiment of the present application, as illustrated in FIG. 8, the printed circuit board includes: the support substrate 110; the insulating substrate 120; the wiring portions 130; and the protective layer 140. The wiring portions 130 are formed on the insulating substrate 120, and the protective layer 140 is formed on the wiring portions.

That is, in the embodiment of FIG. 8, the insulating substrate is formed on the support substrate 110; the wiring portions 130 are formed on the insulating substrate 120; the protective layer 140 is formed on the wiring portions 130 of the bending portion 190; the protective laminated layer portion 150 is formed on the wiring portions in the entire remaining area except for the bending portion; and an embossed bending portion 171 is formed on the bending portion 190, so that the embossed bending portion 171 can function to prevent the printed circuit board from being damaged upon forming the bending portion 190 by bending of the printed circuit board.

At this time, the protective layer 140 is formed over the entire remaining area of the bending portion 190 except for the embossed bending portion 171 from the bending portion 190.

As such, when the protective layer 140 is formed in the entire remaining area of the bending portion 190 except for the embossed bending portion 171, the insulating substrate 120 of the printed circuit board is protected so that damage to the bending portion 190 of the printed circuit board can be reduced.

As set forth above, according to some embodiments of the present application, the protective layer is formed in the wiring portions on the bending portion of the printed circuit board so that the bending portion can be prevented from being damaged upon bending the printed circuit board, thereby facilitating production of the printed circuit board and a lighting unit and facilitating a design of the printed circuit board by solving a restriction on the arrangement of circuit wirings.

Also, according to some embodiments of the present application, the printed circuit board can have a slim structure without damage to wirings of the printed circuit board by adjusting a size of the area of the protective layer formed in a bending portion of the printed circuit board.

An aspect of embodiments of the present application provides a printed circuit board in which a protective layer is formed in a bending portion of the printed circuit board so that the bending portion can be prevented from being damaged upon bending the printed circuit board, thereby enabling easy production of the printed circuit board and a lighting unit and facilitating an easier design of the printed circuit board by solving a restriction on the arrangement of circuit wirings.

Another aspect of embodiments of the present application also provides a printed circuit board having a slim structure without damage to wirings of the printed circuit board by adjusting a size of the area of a protective layer formed in a bending portion of the printed circuit board.

According to an aspect of embodiments of the present application, there is provided a printed circuit board, including: a support substrate including a first region in which light emitting elements are mount, a second region extending from the first region, and a bending portion between the first region and the second region; an insulating substrate on the support substrate; wiring portions on the insulating substrate; and a protective layer on the wiring portions.

The protective layer may be formed on the bending portion.

The protective layer may be disposed within a predetermined range from the wiring portions on the bending portion.

The bending portion may include bending holes, and the protective layer is formed in the entire remaining area of the bending portion except from the bending holes from the bending portion.

The wiring portions may be formed in the protective layer not to come into contact with the insulating substrate.

The protective layer may be made of a solder resist.

An upper surface of the wiring portions may be formed lower than a surface of the bending portion to which the protective layer is exposed.

The protective layer may be formed on the bending portion to have a predetermined width.

The protective layer may contain at least one of polyimide, polyester, epoxy resin, phenolic resin, silicon, polypropylene and teflon.

The wiring portion may contain Cu.

The printed circuit board may further include a connector formed at one end of the second region and connected to the wiring portions.

The connector may be disposed at a side end that is parallel to an arrangement direction of the bending portion on the printed circuit board.

The connector may be disposed at a side end in a different direction from the arrangement direction of the bending portion on the printed circuit board.

The printed circuit board may further include a protective laminated layer portion formed on the wiring portions in the remaining area except for the bending portion.

The printed circuit board may further include an embossed bending portion formed in the remaining area except for the wiring portions or the protective layer on the bending portion.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present application and is not to be construed as limited to the specific embodiments disclosed, and that modifications to the disclosed embodiments, as well as other embodiments, are intended to be included within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A printed circuit board, comprising:
a support substrate including a first region in which light emitting elements are mounted, a second region that extends from the first region, and a bending portion between the first region and the second region;
an insulating substrate on the support substrate;
wiring portions on the insulating substrate;
a protective layer on a first section of the wiring portions at the bending portion; and
a protective laminated layer portion on a second section of the wiring portions away from the bending portion,
wherein the bending portion includes a plurality of bending holes provided at regular intervals between the wiring portions in the bending portion, and
wherein the protective layer is formed from a first material that differs from a second material forming the protective laminated layer portion, and the first material forming the protective layer is more flexible than the second material forming the protective laminated layer portion.

2. The printed circuit board of claim 1, wherein the protective layer is formed on the bending portion.

3. The printed circuit board of claim 2, wherein the protective layer is provided within a predetermined range from the wiring portions on the bending portion.

4. The printed circuit board of claim 1, wherein the protective layer is provided throughout areas of the bending portion except for the bending holes.

5. The printed circuit board of claim 1, wherein the wiring portions are formed in the protective layer not to come into contact with the insulating substrate.

6. The printed circuit board of claim 1, wherein the first material forming the protective layer includes a solder resist.

7. The printed circuit board of claim 1, wherein an upper surface of the wiring portions is formed lower than a surface of the bending portion to which the protective layer is exposed.

8. The printed circuit board of claim 1, wherein the protective layer is formed on the bending portion to have a predetermined width.

9. The printed circuit board of claim 1, wherein the first material forming the protective layer contains at least one of polyimide, polyester, epoxy resin, phenolic resin, silicon, polypropylene, or teflon.

10. The printed circuit board of claim 1, wherein the wiring portion contains copper (Cu).

11. The printed circuit board of claim 1, further comprising a connector formed at one end of the second region and connected to the wiring portions.

12. The printed circuit board of claim 11, wherein the connector is provided at a side end that is parallel to an arrangement direction of the bending portion on the printed circuit board.

13. The printed circuit board of claim 11, wherein the connector is provided at a side end in a different direction from the arrangement direction of the bending portion on the printed circuit board.

14. The printed circuit board of claim 1, further comprising an embossed bending portion formed in areas except for the wiring portions or the protective layer on the bending portion.

15. The printed circuit board of claim 1, wherein the second material forming the protective laminated layer portion contains a thermosetting plastic.

* * * * *